United States Patent
Ye et al.

(10) Patent No.: US 7,656,664 B2
(45) Date of Patent: Feb. 2, 2010

(54) AIRFLOW DIRECTION CONTROLLING APPARATUS

(75) Inventors: Zhen-Xing Ye, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 292 days.

(21) Appl. No.: 11/736,591

(22) Filed: Apr. 18, 2007

(65) Prior Publication Data

US 2008/0024979 A1    Jan. 31, 2008

(30) Foreign Application Priority Data

Jul. 26, 2006    (CN) .................... 2006 1 0061809

(51) Int. Cl.
*H05K 7/20* (2006.01)

(52) U.S. Cl. .................... 361/695; 361/694; 361/691; 361/692

(58) Field of Classification Search ................ 361/691, 361/692, 694, 695; 165/80.3, 80.4, 104.34; 454/184–186; 700/299, 300
See application file for complete search history.

(56) References Cited

U.S. PATENT DOCUMENTS

| | | | | | |
|---|---|---|---|---|---|
| 3,443,588 | A | * | 5/1969 | Banko | 137/601.08 |
| 3,746,042 | A | * | 7/1973 | Finkel | 137/601.06 |
| 4,452,391 | A | * | 6/1984 | Chow | 236/49.3 |
| 4,541,326 | A | * | 9/1985 | Fukuda et al. | 454/258 |
| 5,020,423 | A | * | 6/1991 | Hill | 454/319 |
| 5,364,303 | A | * | 11/1994 | Terry | 454/155 |
| 5,443,420 | A | * | 8/1995 | Kim et al. | 454/256 |
| 5,769,709 | A | * | 6/1998 | Kim | 454/318 |
| 5,810,661 | A | | 9/1998 | Bang | |
| 6,031,719 | A | * | 2/2000 | Schmitt et al. | 361/695 |
| 6,484,521 | B2 | * | 11/2002 | Patel et al. | 62/171 |
| 6,817,196 | B2 | * | 11/2004 | Malone et al. | 62/171 |
| 6,826,048 | B1 | * | 11/2004 | Dean et al. | 361/695 |
| 7,399,222 | B2 | * | 7/2008 | Moon et al. | 454/277 |
| 2001/0014284 | A1 | * | 8/2001 | McCabe | 415/146 |
| 2004/0159713 | A1 | * | 8/2004 | Schmidt et al. | 236/49.3 |
| 2004/0194484 | A1 | * | 10/2004 | Zou et al. | 62/186 |
| 2005/0176364 | A1 | * | 8/2005 | Gehring et al. | 454/155 |
| 2006/0071087 | A1 | * | 4/2006 | Kates | 236/1 B |

(Continued)

FOREIGN PATENT DOCUMENTS

JP    57077847 A    *    5/1982

(Continued)

*Primary Examiner*—Anatoly Vortman
(74) *Attorney, Agent, or Firm*—Frank R. Niranjan (57) ABSTRACT

An airflow direction controlling apparatus includes a frame arranged near an outlet of a fan, at least one blade pivotably mounted to the frame and driven by a motor, at least two thermal sensors for detecting temperatures of at least two electronic components in a computer, and a control module electronically connected to the at least two sensors and the motor. The control module receives the detected temperatures from the sensors, determines if an electronic component is in danger of overheating, and controls the motor to rotate the at least one blade to a desired position where airflow of the fan blows toward the electronic component in danger of overheating, to quickly dissipate the heat generated by the electronic component.

11 Claims, 6 Drawing Sheets

U.S. PATENT DOCUMENTS

| | | | | |
|---|---|---|---|---|
| 2006/0071089 A1 * | 4/2006 | Kates | ................ | 236/94 |
| 2007/0095518 A1 * | 5/2007 | Kates | ................ | 165/208 |
| 2007/0137243 A1 * | 6/2007 | Lee et al. | ................ | 62/419 |
| 2007/0298706 A1 * | 12/2007 | Hudon et al. | ................ | 454/256 |
| 2008/0310100 A1 * | 12/2008 | Sherrod et al. | ................ | 361/687 |

FOREIGN PATENT DOCUMENTS

| | | | |
|---|---|---|---|
| JP | 62210290 A | * | 9/1987 |
| JP | 01079533 A | * | 3/1989 |
| JP | 06066445 A | * | 3/1994 |

* cited by examiner

AIRFLOW DIRECTION CONTROLLING APPARATUS

BACKGROUND OF THE INVENTION

1. Field of the Invention

The present invention relates to airflow direction controlling apparatuses, and particularly to an airflow direction controlling apparatus for a fan in a computer.

2. Description of Related Art

With the continued development of computer technology, electronic components in computers such as central processing units (CPUs) are generating more and more heat that needs to be dissipated immediately to avoid damage to the circuitry. Therefore, thermal modules are widely used to remove heat from the CPUs. A conventional thermal module includes a heat sink secured on a CPU and a CPU fan secured on the heat sink. Heat generated by the CPU is conducted by the heat sink and then dissipated away from the CPU by the CPU fan. However, thermal module designs typically fail to take into account the cooling of other electronic components within computers such as memories, hard disks, and graphic cards to keep manufacturing costs down. When temperatures of such electronic components get too high, the performance of the computers may be impaired.

What is needed, therefore, is an airflow direction controlling apparatus which can selectively direct airflow of a fan toward an overheated electronic component in a computer.

SUMMARY OF THE INVENTION

An airflow direction controlling apparatus for selectively directing airflow of a fan toward one of at least two electronic components in danger of overheating in a computer is provided. In a preferred embodiment, the controlling apparatus includes a frame configured for being arranged near an outlet of the fan, at least one blade pivotably mounted to the frame and driven by a motor, at least two thermal sensors configured for detecting temperatures of the at least two electronic components in the computer, and a control module electronically connected to the at least two sensors and the motor. The control module receives the detected temperatures from the sensors, determines if an electronic component is in danger of overheating, and controls the motor to rotate the at least one blade to a desired position where airflow of the fan blows toward the electronic component in danger of overheating, to quickly dissipate the heat generated by the electronic component.

Other objects, advantages and novel features of the present invention will become more apparent from the following detailed description of preferred embodiment when taken in conjunction with the accompanying drawings, in which:

DETAILED DESCRIPTION OF THE INVENTION

Referring to FIGS. 1, 2, 3, 4 and 5, an airflow direction controlling apparatus in accordance with a preferred embodiment of the present invention includes a frame 10, five blades 20 pivotably mounted to the frame 10, a motor 30, a control module 40, three thermal sensors 50, 51, and 52, and a pinion rack 60.

Figure 1:
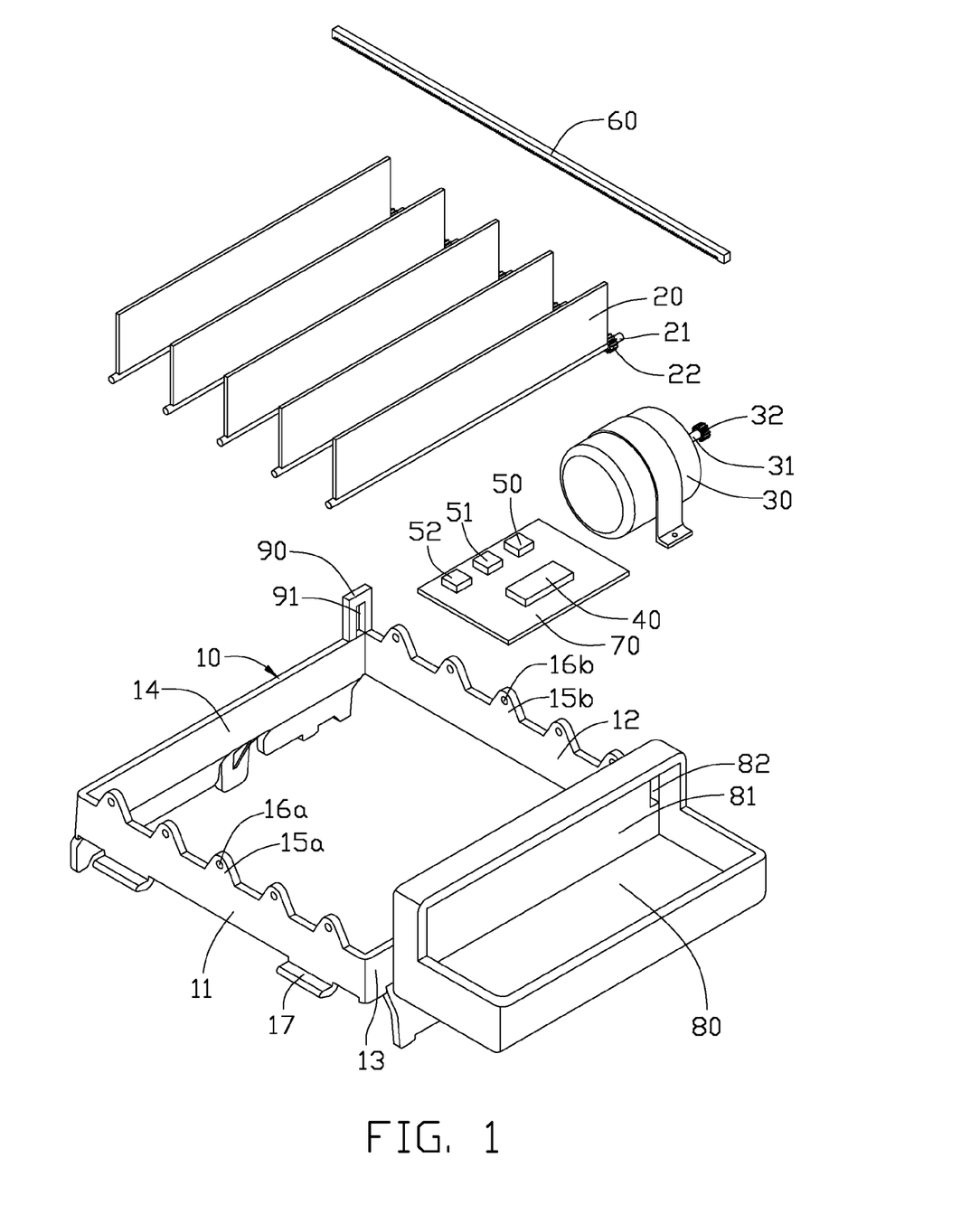
FIG. 1 is an exploded, isometric view of an airflow direction controlling apparatus, in accordance with a preferred embodiment of the present invention.
Figure 2:
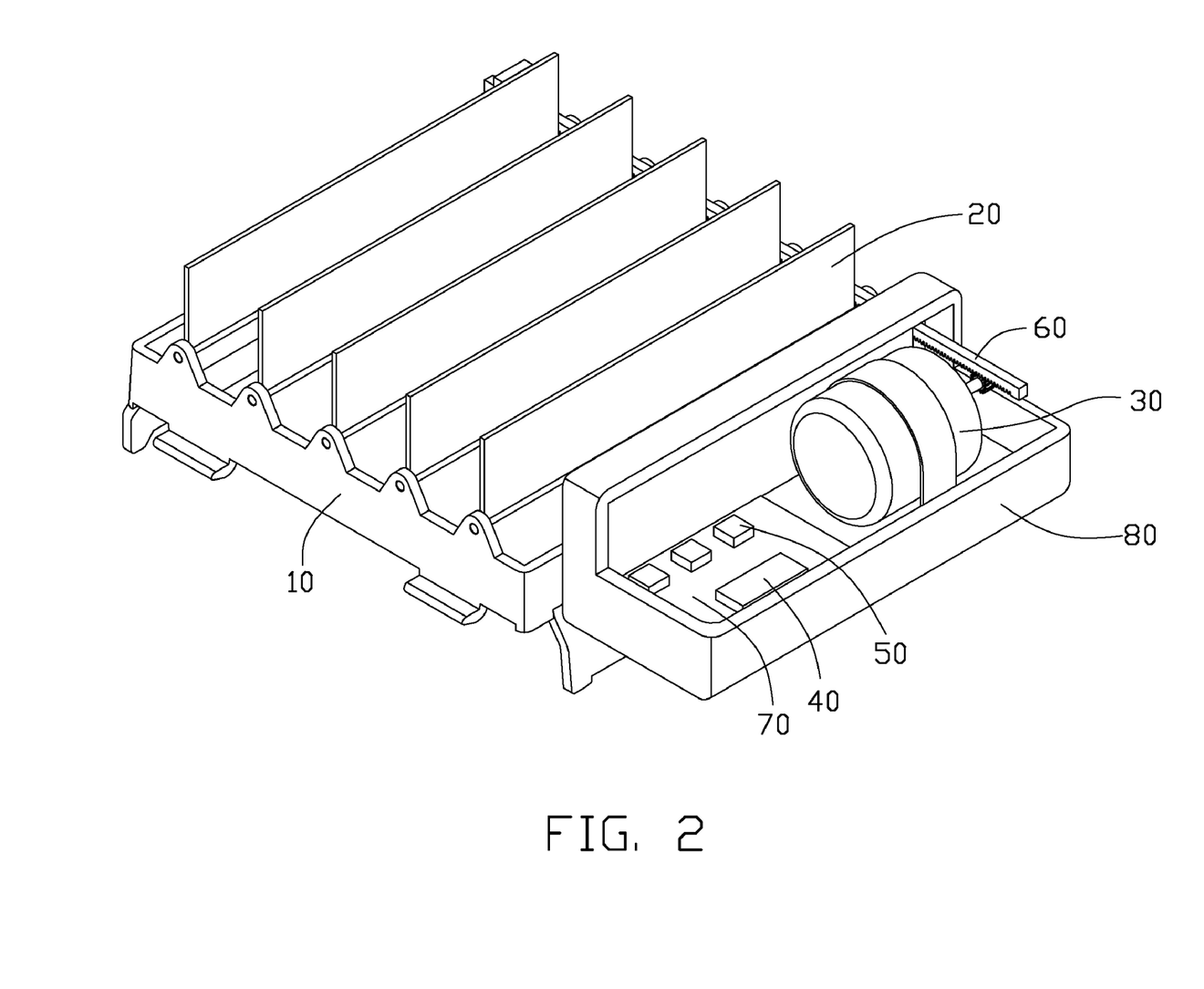
FIG. 2 is an assembled view of FIG. 1.
Figure 3:
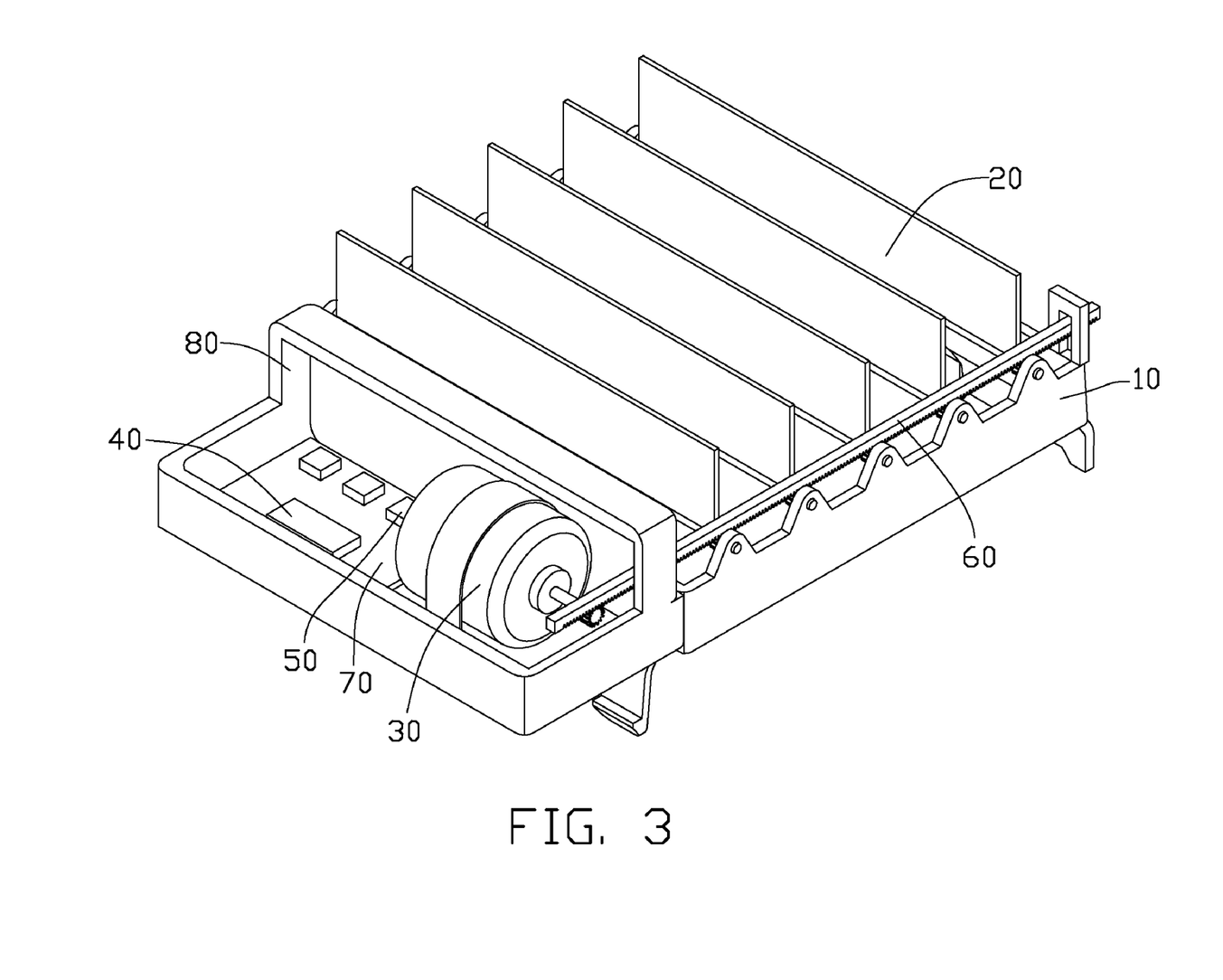
FIG. 3 is an assembled view of FIG. 1, but viewed from another aspect.

The frame 10 includes two opposite side walls 11, 12, and two opposite connecting walls 13, 14 connecting the side walls 11, 12. Five support portions 15a each defining a pivot hole 16a therein extend evenly from the side wall 11. Another five support portions 15b each defining a pivot hole 16b therein corresponding to the five support portions 15a extend from the side wall 12. A plurality of retaining portions 17 extend down from the connecting walls 13, 14 and the side wall 11 of the frame 10, for mounting the controlling apparatus to an enclosure (not shown) of a computer via engaging in through holes of the enclosure. A fan 100 may be accommodated at a space between the frame 10 and the enclosure.

Each blade 20 includes a pivot 21 at the bottom thereof. Two opposite ends of the pivot 21 engage in pivot holes 16a and 16b of corresponding support portions 15a and 15b. One end of the pivot 21 adjacent the side wall 12 includes a pinion 22.

A bracket 80 is formed beside the connecting wall 13 of the frame 10 to accommodate the motor 30 and the control module 40 therein. The motor 30 includes a shaft 31 therein. The shaft 31 includes a pinion 32 at an end thereof. The motor 30 is mounted to the bracket 80 where the pinion 32 of the motor 30 is arranged in alignment with the pinions 22 of the blades 20. The control module 40 and the sensors 50, 51, 52 are mounted to a control circuit board 70. The control circuit board 70 is mounted to the bracket 80 adjacent the motor 30.

The bracket 80 includes a partition board 81 adjacent to and parallel to the connecting wall 13. A protrusion 90 defining a first limiting slot 91 extends up from an end of the connecting wall 14 adjacent to the side wall 12. The partition board 81 defines a second limiting slot 82 in alignment with the first limiting slot 91. The limiting slots 91, 92 are aligned with the pivot holes 16b. The pinion rack 60 defining a plurality of teeth is inserted through the first limiting slot 91 and the second limiting slot 82 to engage with the pinion 32 of the motor 30 and the pinions 22 of the blades 20. The pinion rack 60 is moved back and forth via the pinion 32 of the motor 30 and guided by the first limiting slot 91 and the second limiting slot 82.

Figure 6:
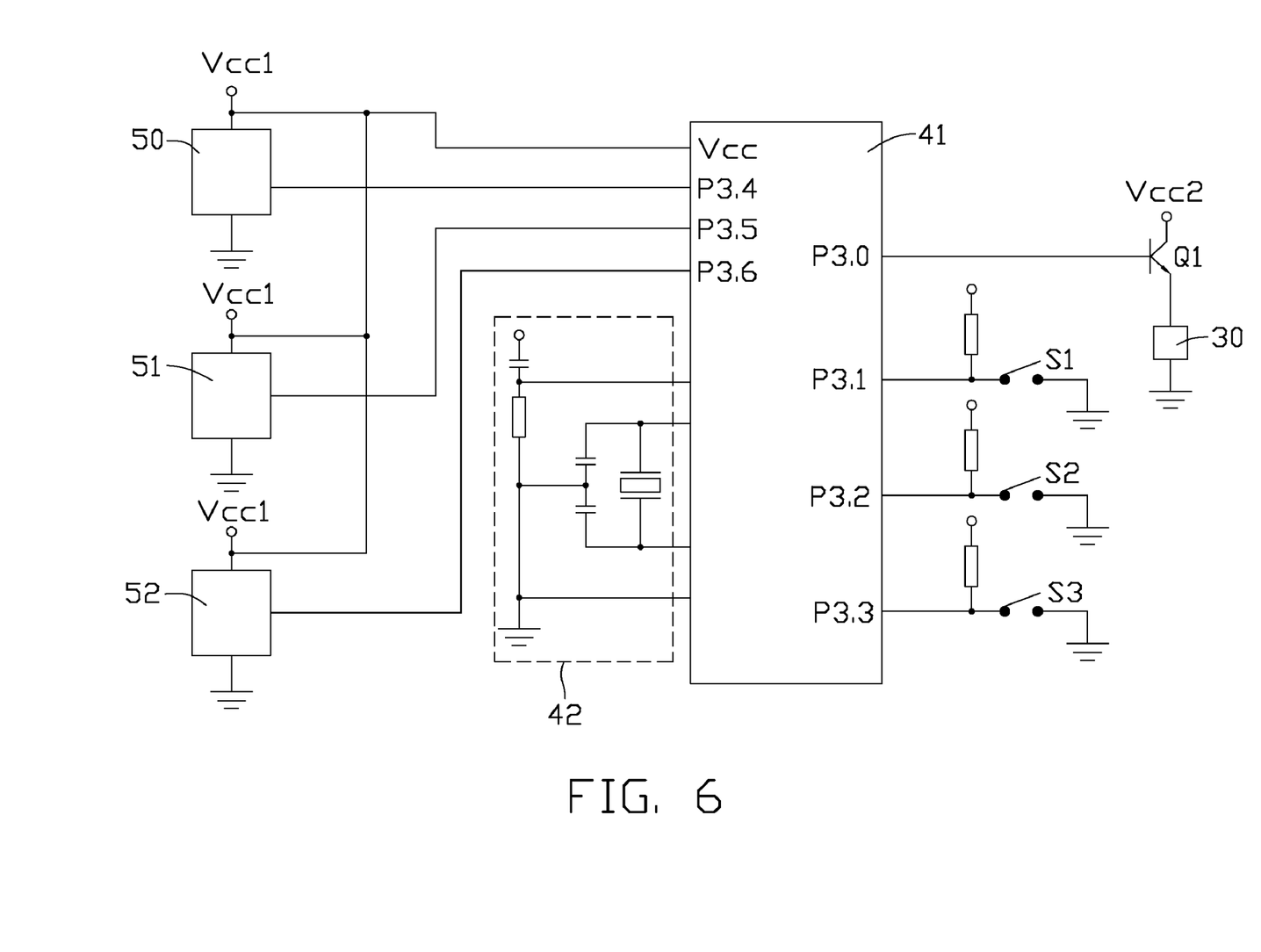
FIG. 6 is a circuit diagram of the controlling apparatus of FIG. 1.

Referring to FIG. 6, the control module 40 includes a microprocessor 41, a reset circuit 42, trigger switches S1, S2, S3, and a transistor Q1 connected to the microprocessor 41. The sensors 50, 51, 52 include input terminals respectively connected to three electronic components 110, 111, 112 to monitor their temperatures, power supply terminals connected to a power supply terminal Vcc1, and output terminals respectively connected to input/output ports P3.4, P3.5, P3.6 of the microprocessor 41. A power port Vcc of the microprocessor 41 is connected to the power supply terminal Vcc1. The trigger switches S1, S2, S3 are respectively connected to input/output ports P3.1, P3.2, P3.3 of the microprocessor 41. The transistor Q1 includes a base connected to an input/output port P3.0 of the microprocessor 41, a collector connected to a power supply terminal Vcc2, and an emitter connected to the motor 30.

Figure 4:
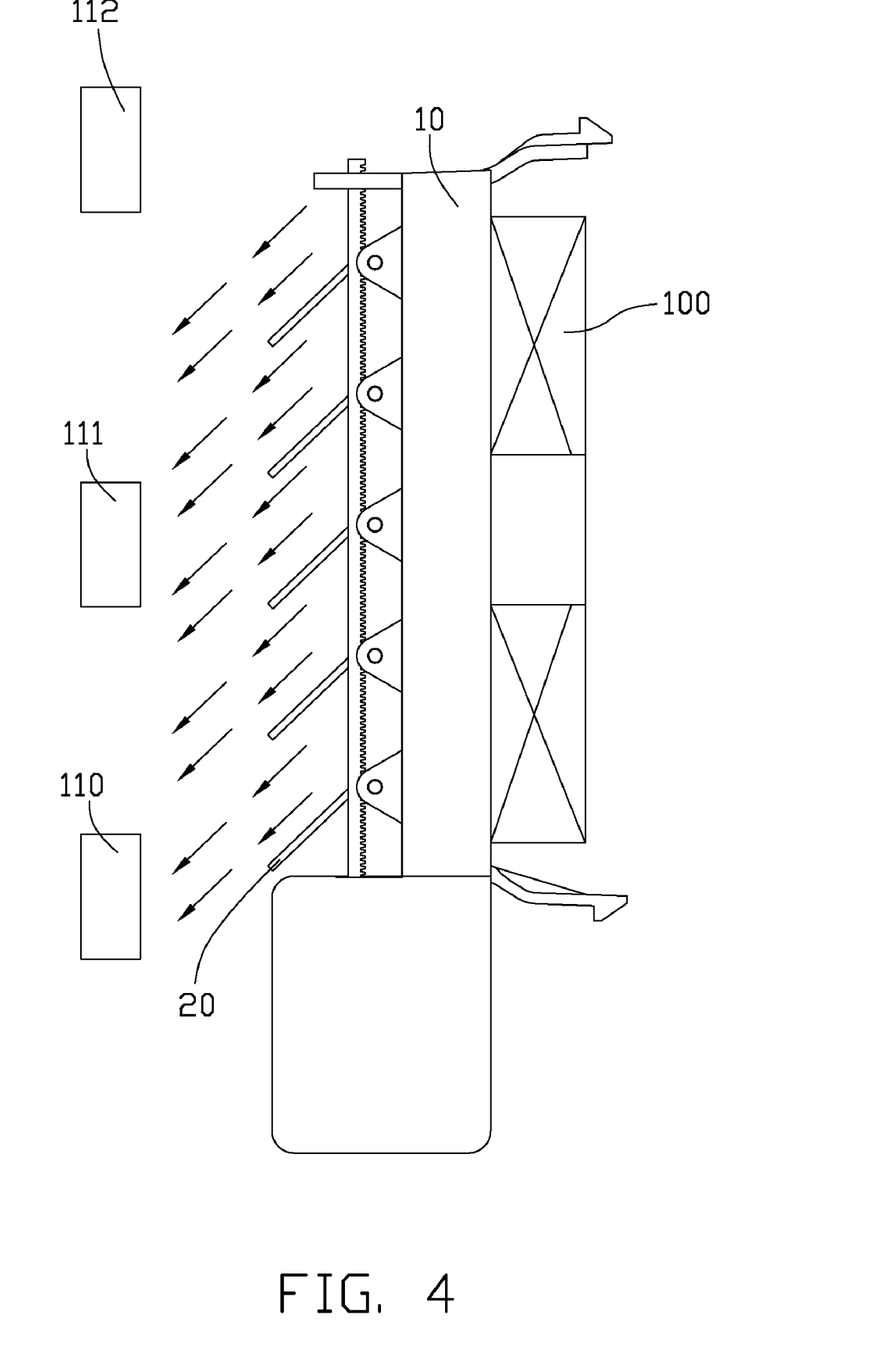
FIG. 4 is a profile view of airflow of a fan blowing toward an electronic component in danger of overheating.
Figure 5:
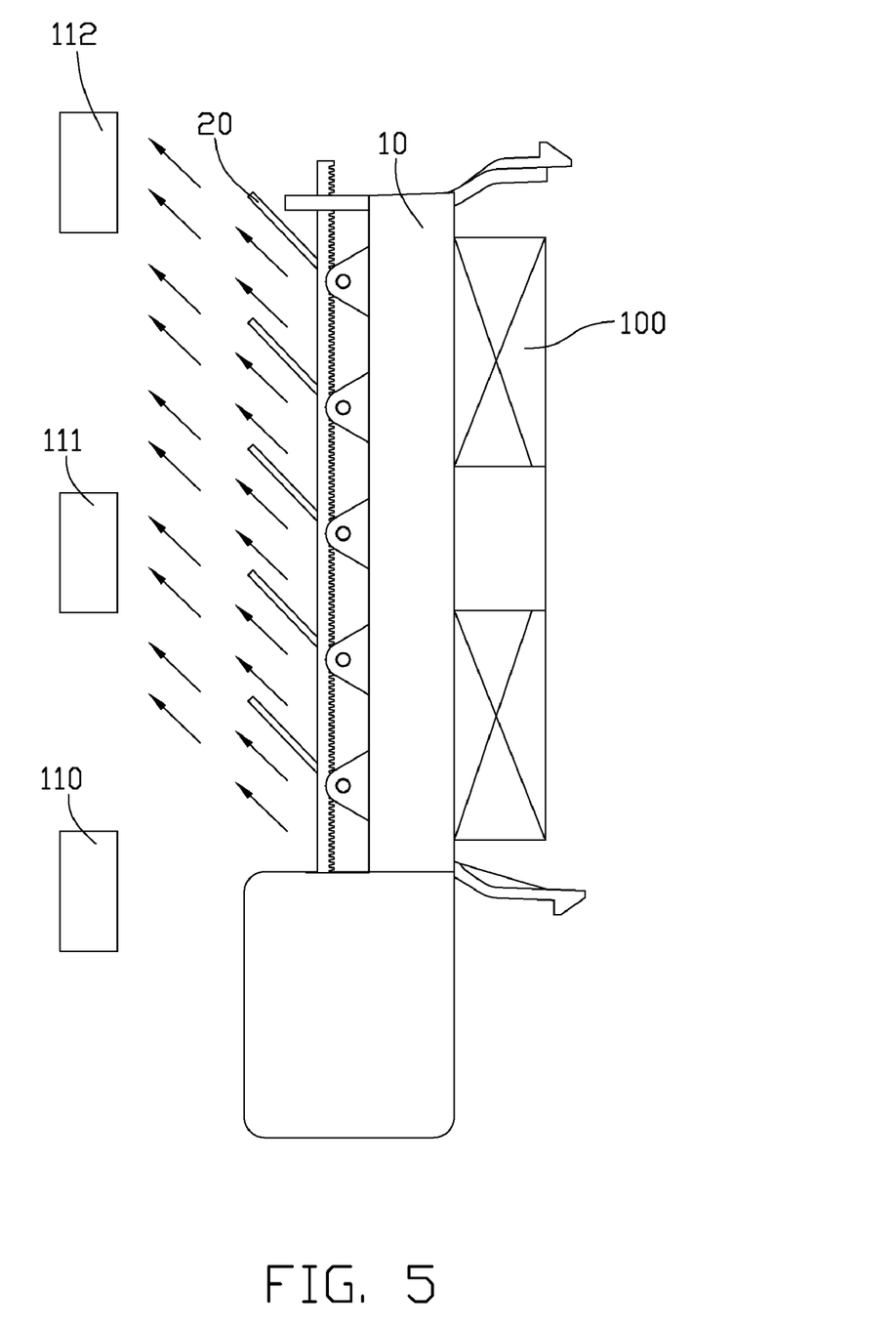
FIG. 5 is a profile view of airflow of the fan blowing toward another electronic component in danger of overheating.

In application, the sensors 50, 51, 52 respectively detect temperatures of the three electronic components 110, 111, 112. Temperatures are then provided to the microprocessor 41 by the sensors 50, 51, and 52. The microprocessor 41 determines if an electronic component is in danger of overheating by comparing the detected temperatures with a predetermined temperature or temperatures. If one of the temperatures exceeds the corresponding predetermined temperature, the microprocessor 41 controls the trigger switch corresponding to the electronic component, which is in danger of overheating, to switch off, causing the transistor Q1 to turn on for a predetermined period of time, making the motor 30 rotate the blades 20 via the rack 60 to a desired position where airflow of the fan 100 blows toward the corresponding electronic component, to quickly dissipate the heat generated by the electronic component. For examples, FIG. 4 shows a profile view of airflow of the fan 100 blowing toward the electronic component 110 when the electronic component 110 is in danger of overheating, and FIG. 5 shows a profile view of airflow of the fan 100 blowing toward the electronic component 112 when the electronic component 112 is in danger of overheating.

The number of the sensors and switch as disclosed above can be adjusted according to the number of the electronic components it is desired to monitor and cool when needed. The number of the blades as disclosed above can also be adjusted according to the size of the fan 100.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An airflow direction controlling apparatus for selectively directing airflow of a fan toward one of at least two electronic components in danger of overheating in a computer, comprising:
   a frame being arranged near an outlet of the fan, wherein the frame comprises two opposite side walls;
   at least one blade pivotably mounted to the frame and driven by a motor comprising a pinion; wherein each of the at least one blade comprises a pivot at the bottom thereof, and the pivot of each of the at least one blade engages in the two opposite side walls of the frame; wherein one end of the pivot has a pinion, and the pinion of the motor and the pinion of the pivot are meshed with a pinion rack;
   at least two thermal sensors configured for detecting temperatures of the at least two electronic components in the computer; and
   a control module electronically connected to the at least two sensors and the motor, the control module receiving the detected temperatures from the sensors, determining if an electronic component is in danger of overheating, and controlling the motor to pivot the at least one blade around the pivot thereof via the pinion rack to a desired position where airflow of the fan blows toward the electronic component in danger of overheating to quickly dissipate the heat generated by the electronic component.

2. The controlling apparatus as claimed in claim 1, wherein the control module and the sensors are mounted to a control circuit board, and the motor and the control circuit board are mounted to a bracket adjacent to the frame.

3. The controlling apparatus as claimed in claim 2, wherein the bracket comprises a partition board adjacent to one of the connecting walls, a protrusion defining a first limiting slot extends up from an end of the other connecting wall adjacent to one of the side walls, the partition board defines a second limiting slot in alignment with the first limiting slot, the pinion rack movably engages in the first and second limiting slots.

4. The controlling apparatus as claimed in claim 1 wherein a first support portion defines a pivot hole therein extends from one of the side walls, a second support portion defining a pivot hole therein corresponding to the first support portion extends from the other one of the side walls, two opposite ends of the pivot of the at least one blade pivotably engage in pivot holes of the first and second support portions.

5. The controlling apparatus as claimed in claim 1, wherein a plurality of retaining portions extends down from the frame, configured for mounting the frame to the computer.

6. The controlling apparatus as claimed in claim 1, wherein the control module comprises a microprocessor, a reset circuit, at least two trigger switches, and a transistor connected to the microprocessor, the motor is connected to the transistor, the microprocessor controls the trigger switch corresponding to the electronic component in danger of overheating to switch on or off, causing the transistor to turn on or off for a predetermined period of time, making the motor rotate the at least one blade to the desired position.

7. A controlling apparatus for selectively directing an airflow toward one of a plurality of electronic components, comprising:
   a frame being arranged in the airflow;
   a plurality of blades pivotably mounted to the frame and driven by a driving device;
   a plurality of thermal sensors configured for detecting temperatures of the electronic components;
   a control module electronically connected to the sensors and the driving device and configured for determining whether one of the electronic components is in danger of overheating based on the detected temperatures transmitted from the sensors and controlling the driving device to rotate the blades to a desired position where the airflow blows toward the electronic component in danger of overheating, whereby the airflow quickly dissipates heat from the electronic component in danger of overheating; and
   a bracket at which the driving device, the sensors and the control module are arranged, wherein a pair of limiting slots is defined in the frame and the bracket receives a rack for guiding movement of the rack.

8. The controlling apparatus as claimed in claim 7, wherein the rack defines a plurality of teeth, and each of the blades is pivotably attached to the frame via a pivot defining teeth meshed with the teeth of the rack.

9. The controlling apparatus as claimed in claim 8, wherein the frame comprises a pair of side walls each defining a plurality of pivot holes for receiving the pivots of the blades therein, the blades are arranged between the side walls and the rack is arranged at one side of the blades adjacent to one of the side walls.

10. The controlling apparatus as claimed in claim 8 wherein the driving device comprises a motor having a shaft on which a pinion is provided, the pinion meshed with the teeth of the rack.

11. An airflow direction controlling apparatus for selectively directing airflow of a fan toward one of at least two electronic components in danger of overheating in a computer, comprising:
- a frame being arranged near an outlet of the fan, wherein the frame comprises two opposite side walls, and two opposite connecting walls connecting the side walls;
- at least one blade pivotably mounted to the frame and driven by a motor;
- at least two thermal sensors configured for detecting temperatures of the at least two electronic components in the computer; and
- a control module electronically connected to the at least two sensors and the motor, the control module receiving the detected temperatures from the sensors, determining if an electronic component is in danger of overheating, and controlling the motor to rotate the at least one blade via a pinion rack guided by the frame to a desired position where airflow of the fan blows toward the electronic component in danger of overheating to quickly dissipate the heat generated by the electronic component, wherein the control module and the sensors are mounted to a control circuit board, and the motor and the control circuit board are mounted to a bracket adjacent to the frame.

* * * * *